(12) United States Patent
Bell et al.

(10) Patent No.: US 11,467,126 B2
(45) Date of Patent: Oct. 11, 2022

(54) BAW BIOSENSOR INCLUDING HEATER AND TEMPERATURE SENSOR AND METHODS FOR USING THE SAME

(71) Applicant: QORVO US, INC., Greensboro, NC (US)

(72) Inventors: Florian Bell, Bend, OR (US); Rick Morton, Bend, OR (US); William Crawford Randle, Bend, OR (US); Cody William Rombach, Medford, OR (US); Donna Kay Barton, Bend, OR (US)

(73) Assignee: Qorvo US, Inc., Greensboro, NC (US)

( * ) Notice: Subject to any disclaimer, the term of this patent is extended or adjusted under 35 U.S.C. 154(b) by 694 days.

(21) Appl. No.: 16/321,712

(22) PCT Filed: Jul. 26, 2017

(86) PCT No.: PCT/US2017/043958
§ 371 (c)(1),
(2) Date: Jan. 29, 2019

(87) PCT Pub. No.: WO2018/022757
PCT Pub. Date: Feb. 1, 2018

(65) Prior Publication Data
US 2021/0140922 A1 May 13, 2021

Related U.S. Application Data

(60) Provisional application No. 62/368,261, filed on Jul. 29, 2016, provisional application No. 62/370,788, filed on Aug. 4, 2016.

(51) Int. Cl.
*G01N 29/02* (2006.01)
*G01N 29/036* (2006.01)
(Continued)

(52) U.S. Cl.
CPC ......... *G01N 29/022* (2013.01); *G01N 29/036* (2013.01); *G01N 29/222* (2013.01);
(Continued)

(58) Field of Classification Search
CPC .. G01N 29/022; G01N 29/036; G01N 29/326; G01N 29/222; G01N 2291/0255;
(Continued)

(56) References Cited

U.S. PATENT DOCUMENTS

| 4,640,756 A | 2/1987 | Wang et al. | |
| 5,173,956 A * | 12/1992 | Hayes | G02F 1/3133 385/16 |

(Continued)

FOREIGN PATENT DOCUMENTS

| WO | 2008/088289 | 7/2008 |
| WO | 2018/022757 | 2/2018 |
| WO | 2018/022778 | 2/2018 |

OTHER PUBLICATIONS

Alder, J.F., et al., "Temperature Compensation of a Surface Acoustic Wave Sensor Using an Integral Temperature Sensor," Analyst, vol. 114, Sep. 1989, pp. 1163-1165.
(Continued)

*Primary Examiner* — Suman K Nath
(74) *Attorney, Agent, or Firm* — Haynes Boone, LLP; Benjamin C. Pelletier; Destiny L. Stephenson

(57) ABSTRACT

A device including at least one sensing bulk acoustic wave (BAW) resonator including a sensing surface; a fluid channel, wherein the sensing surface of the at least one sensing BAW resonator is disposed adjacent to or within the fluid channel; at least one resistive heater; and at least one temperature detector, wherein the at least one temperature detector is configured to monitor the temperature adjacent to
(Continued)

the at least one BAW resonator and affect a current to be passed through the at least one resistive heater.

20 Claims, 3 Drawing Sheets

(51) Int. Cl.
*G01N 29/22* (2006.01)
*H03H 9/02* (2006.01)

(52) U.S. Cl.
CPC . *H03H 9/02102* (2013.01); *G01N 2291/0255* (2013.01); *G01N 2291/0426* (2013.01)

(58) Field of Classification Search
CPC ... G01N 2291/0426; G01N 2291/0256; G01N 2291/101; G01N 30/96; H03H 9/02102
See application file for complete search history.

(56) References Cited

U.S. PATENT DOCUMENTS

| | | | |
|---|---|---|---|
| 5,616,872 | A | 4/1997 | O'Brien |
| 6,294,063 | B1 | 9/2001 | Becker et al. |
| 6,858,185 | B1 | 2/2005 | Kopf-Sill et al. |
| 6,881,314 | B1 | 4/2005 | Wang et al. |
| 6,955,787 | B1 | 10/2005 | Hanson |
| 7,473,551 | B2 | 1/2009 | Warthoe |
| 7,943,388 | B2 | 5/2011 | Baetzold et al. |
| 8,586,351 | B2 | 11/2013 | Villa et al. |
| 8,707,760 | B2 | 4/2014 | Chou et al. |
| 9,791,412 | B2 | 10/2017 | Kukita et al. |
| 9,821,310 | B2 | 11/2017 | Guldiken et al. |
| 9,922,809 | B2 | 3/2018 | McCarron et al. |
| 2002/0051971 | A1 | 5/2002 | Stuelpnagel et al. |
| 2005/0240110 | A1 | 10/2005 | Liu et al. |
| 2006/0034346 | A1* | 2/2006 | Saio .......... G01K 7/00 374/185 |
| 2006/0051010 | A1* | 3/2006 | Chu .......... G02B 6/12007 385/5 |
| 2006/0172409 | A1 | 8/2006 | Shinohara et al. |
| 2006/0216812 | A1 | 9/2006 | Okada et al. |
| 2006/0243064 | A1 | 11/2006 | Liu et al. |
| 2007/0052327 | A1 | 3/2007 | Vilander |
| 2008/0054382 | A1* | 3/2008 | Stetter .......... B81B 3/0059 257/414 |
| 2009/0110605 | A1 | 4/2009 | Kido et al. |
| 2010/0134209 | A1 | 6/2010 | Gabl |
| 2010/0163410 | A1 | 7/2010 | Villa et al. |
| 2010/0247021 | A1* | 9/2010 | Cunningham .......... G02F 1/025 385/1 |
| 2012/0040470 | A1 | 2/2012 | Dorn et al. |
| 2012/0118736 | A1 | 5/2012 | Fan et al. |
| 2012/0164753 | A1 | 6/2012 | Johnston et al. |
| 2012/0196280 | A1 | 8/2012 | Karlsen et al. |
| 2014/0008307 | A1 | 1/2014 | Guldiken et al. |
| 2015/0276727 | A1 | 10/2015 | Talebpour et al. |
| 2016/0013771 | A1* | 1/2016 | Sridaran .......... H03H 9/08 219/209 |
| 2016/0172775 | A1 | 6/2016 | Tischer et al. |
| 2016/0238457 | A1* | 8/2016 | Leighton, II .......... G01K 3/14 |
| 2019/0234907 | A1 | 8/2019 | Edwards et al. |
| 2019/0329255 | A1 | 10/2019 | Edwards |

OTHER PUBLICATIONS

Ballantine, D. S., et al. "Temperature Effects and the Need for Temperature Control " Acoustic Wave Sensors, Theory, Design, and Physico-Chemical Applications. San Diego: Academic Press, 1997. 375-378.

Caldwell, Karin D., et al., "Electrical Field-Flow Fractionation in Particle Separation. 1. Monodisperse Standards," Analytical Chemistry, vol. 65, No. 13, Jul. 1993, pp. 1764-1772.

De Vries, J.W.C., "Temperature and Thickness Dependence of the Resistivity of Thin Polycrystalline Aluminum, Cobalt, Nickel, Palladium, Silver and Gold Films," Thin Solid Films, vol. 167, Nos. 1-2, Dec. 15, 1988, pp. 25-32.

Desai et al., "Electrical Resistivity of Aluminum and Manganese," 1984, J. Phys. Chem. Ref. Data, 13(4):1131-72.

Frey, et al., "Continuous-Flow Multi-Analyte Biosensor Cartridge with Controllable Linear Response Range," Sep. 7, 2010, Lab on a Chip, 10(17):2226-34.

Cale, B.K., et al., "A Micromachined Electrical Field-Flow Fractionation (μ-EFFF) System," IEEE Transactions on Biomedical Engineering, vol. 45, No. 12, Dec. 1998, pp. 1459-1469.

International Patent Application No. PCT/US2017/043958, filed Jul. 26, 2017; International Search Report / Written Opinion dated Oct. 6, 2017; 11 pages.

International Patent Application No. PCT/US2017/043992, filed Jul. 26, 2017; International Search Report / Written Opinion dated Oct. 6, 2017; 9 pages.

Panta et al., "Electrical Characterization of Aluminum (Al) Thin Films Measured by Using Four-Point Probe Method," Dec. 2012, Kathmandu University Journal of Science, 8(2):31-36.

Scuor et al., "Modeling of a Microfluidic Channel in the Presence of an Electrostatic Induced Cross-Flow", Biomedical Microdevices, vol. 7, No. 3, Sep. 15, 2005, pp. 231-242.

Yang, Zhiyong, et al., "Opto-electrophoretic Detection of Biomolecules Using Conducting Chalcogenide Glass Sensors, Optics Express, vol. 18, No. 25, Dec. 6, 2010, pp. 26754-26759.

Office action from U.S. Appl. No. 16/319,410 dated Feb. 12, 2021, 25 pages.

* cited by examiner

BAW BIOSENSOR INCLUDING HEATER AND TEMPERATURE SENSOR AND METHODS FOR USING THE SAME

RELATED APPLICATIONS

This application is the § 371 U.S. National Stage of International Application No. PCT/US2017/043958, filed 26 Jul. 2017, which claims priority to U.S. Provisional Application Ser. No. 62/368,261, filed on 29 Jul. 2016; and 62/370,788 filed on 4 Aug. 2016, the contents of which are incorporated here in their entirety.

FIELD

The present disclosure relates to devices including bulk acoustic wave (BAW) resonators and their use as biosensors. In particular, the present disclosure relates to a device including a BAW resonator, a heater and a temperature sensor.

BACKGROUND

Numerous instruments and measurement techniques exist for diagnostic testing of materials for medical, veterinary medical, environmental, biohazard, bioterrorism, agricultural, and food safety purposes. Diagnostic testing traditionally requires long response times to obtain meaningful data, involves expensive, remote, or cumbersome laboratory equipment, requires large sample size, utilizes multiple reagents, demands highly trained users, and can involve significant direct and indirect costs. For example, in both the human and veterinary diagnostic markets, most tests require that a sample be collected from a patient and then be sent to a laboratory, where the results are not available for several hours or days. As a result, the caregiver must wait to treat the patient.

Point of use (or point of care when discussing human or veterinary medicine) solutions for diagnostic testing and analysis, although capable of solving most of the noted drawbacks, remain somewhat limited. Even some of the point of use solutions that are available, are limited in sensitivity and reproducibility compared to in-laboratory testing. There are also often significant costs involved as separate systems may be needed for different point of use tests.

Bulk acoustic wave (BAW) sensors have been described for use as biosensors. Fluidic devices having BAW sensors for detecting the presence of an analyte in a sample often have biomolecules, such as antibodies or other proteins such as receptors, polynucleic acids, or the like, attached to their surfaces. The analyte may bind to the biomolecule attached to the surface of the sensor and increase the mass bound to the sensor. The increased mass alters the wave propagation characteristics (e.g., magnitude, frequency, phase, etc.) of the sensor. The change in propagation characteristics due to analyte binding may be correlated with the amount of bound analyte and, thus, the amount of analyte in the sample. Numerous factors, including temperature affect the accuracy of the measurements obtained with such biosensors.

SUMMARY

A device including at least one sensing bulk acoustic wave (BAW) resonator including a sensing surface; a fluid channel, wherein the sensing surface of the at least one sensing BAW resonator is disposed adjacent to or within the fluid channel; at least one resistive heater; and at least one temperature detector, wherein the at least one temperature detector is configured to monitor the temperature adjacent to the at least one BAW resonator and affect a current to be passed through the at least one resistive heater.

Also disclosed are methods of controlling the temperature in the vicinity of at least one sensing BAW resonator, the methods including monitoring the temperature in the vicinity of the sensing BAW resonator utilizing a first temperature detector located adjacent the at least one sensing BAW resonator; and passing a current through a first resistive heater located adjacent the at least one sensing BAW resonator, the current based on the temperature monitored by the first temperature detector.

The above summary is not intended to describe each embodiment of the present disclosure. The details of one or more embodiments of the present disclosure are also set forth in the description below. Other features, objects, and advantages of the present disclosure will be apparent from the description and from the claims.

BRIEF DESCRIPTION OF DRAWINGS

The drawings are not necessarily to scale. Like numbers used in the figures refer to like parts. However, the use of different numbers to refer to components is not intended to indicate that the different numbered components cannot be the same or similar.

DETAILED DESCRIPTION

Figure 1:
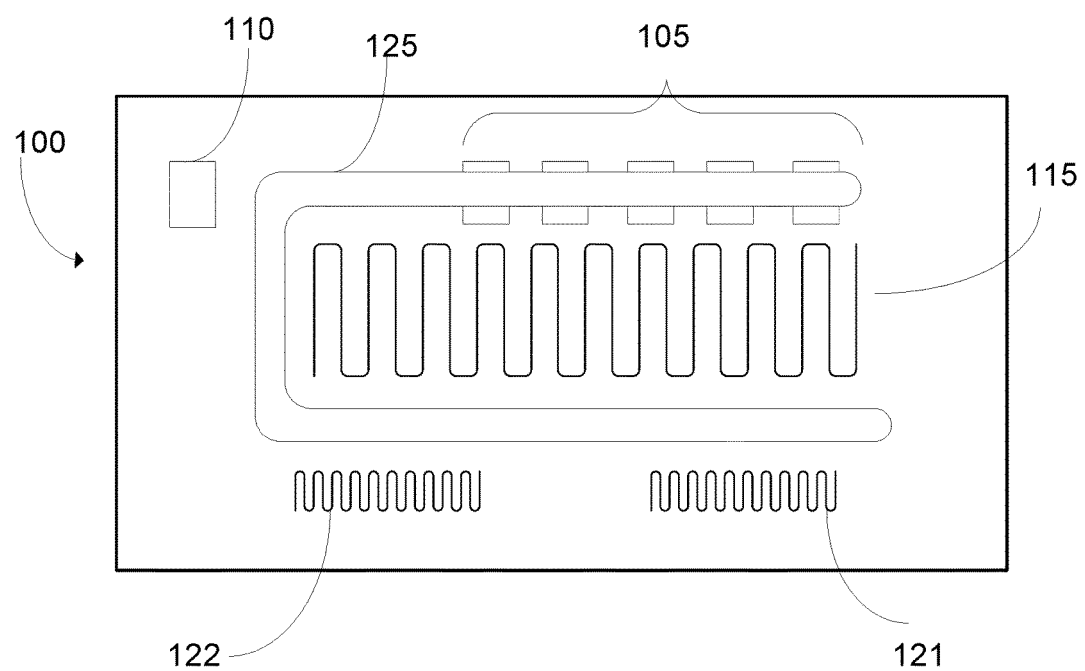
FIG. 1 is a schematic perspective view of a system according to an embodiment.

In the following detailed description, several specific embodiments of compounds, compositions, products and methods are disclosed. It is to be understood that other embodiments are contemplated and may be made without departing from the scope or spirit of the present disclosure. The following detailed description, therefore, is not to be taken in a limiting sense.

All scientific and technical terms used herein have meanings commonly used in the art unless otherwise specified. The definitions provided herein are to facilitate understanding of certain terms used frequently herein and are not meant to limit the scope of the present disclosure.

As used in this specification and the appended claims, the singular forms "a", "an", and "the" encompass embodiments having plural referents, unless the content clearly dictates otherwise.

As used in this specification and the appended claims, the term "or" is generally employed in its sense including "and/or" unless the content clearly dictates otherwise. The term "and/or" means one or all of the listed elements or a combination of any two or more of the listed elements.

As used herein, "have", "having", "include", "including", "comprise", "comprising" or the like are used in their open-ended sense, and generally mean "including, but not limited to." It will be understood that "consisting essentially of," "consisting of," and the like are subsumed in "comprising" and the like. As used herein, "consisting essentially of," as it relates to a composition, product, method or the like, means that the components of the composition, product, method or the like are limited to the enumerated components and any other components that do not materially affect the basic and novel characteristic(s) of the composition, product, method or the like.

The words "preferred" and "preferably" refer to embodiments of the invention that may afford certain benefits, under certain circumstances. However, other embodiments may also be preferred, under the same or other circumstances. Furthermore, the recitation of one or more preferred embodiments does not imply that other embodiments are not useful, and is not intended to exclude other embodiments from the scope of the disclosure, including the claims.

Also herein, the recitations of numerical ranges by endpoints include all numbers subsumed within that range (e.g., 1 to 5 includes 1, 1.5, 2, 2.75, 3, 3.80, 4, 5, etc. or 10 or less includes 10, 9.4, 7 0.6, 5, 4.3, 2.9, 1.62, 0.3, etc.). Where a range of values is "up to" a particular value, that value is included within the range.

Any direction referred to herein, such as "top," "bottom," "left," "right," "upper," "lower," and other directions and orientations are described herein for clarity in reference to the figures and are not to be limiting of an actual device or system or use of the device or system. Devices or systems as described herein may be used in a number of directions and orientations.

Piezoelectric materials used as the energy transduction medium in bulk acoustic wave (BAW) resonators generally exhibit temperature dependence in several material parameters. These parameters include the piezoelectric coefficients, the material density, the acoustic velocity, and the permittivity. Of these factors, the piezoelectric coefficients are most sensitive to changes in temperature, with an approximate variation of 30 ppm/Kelvin. For a practical sensor used in a lab or office environment in which temperature changes can be as much as 5°-10° Kelvin (K), the net variation in the coefficients can be as much as 300 ppm. By contrast, when using the BAW device as a mass sensor, a 1 pg mass loading results in perhaps 20 ppm change in the BAW resonant frequency. Therefore, temperature drifts superimposed upon signals can easily degrade the signal-to-noise level to less than unity, making the device unusable. To correct this, a compensation scheme can be utilized to remediate the effect of temperature.

An illustrative process for offsetting the effects of temperature can include the following steps: using a passive compensation scheme based in the design of the device; stabilizing the device in a temperature controlled environment (e.g., an oven); using a reference resonator to null the effects of temperature; measuring the drift in temperature and correcting data based on an algorithm; measuring the drift in temperature and increasing temperature as necessary using a heater adjacent to BAW resonator; and combinations thereof.

Disclosed herein are methods and devices for accomplishing the measurement of temperature and increasing temperature using one or more heaters adjacent to the BAW resonator. The present disclosure relates to devices including at least one bulk acoustic wave (BAW) resonator, at least one resistive heater and at least one temperature sensor.

Disclosed devices can also be described as dies with various components built therein, thereon or both. The terms die and device will be utilized interchangeably herein. As shown schematically in FIG. 1, a device 100 includes at least one sensing BAW resonator, depicted herein as including five (5) BAW resonators (at least one of which is a sensing BAW resonator, but it should also be noted that at least one may also be a non-specific reference BAW resonator) 105; an external reference BAW resonator 110; at least one resistive heater 115; and at least one temperature detector, depicted herein as including two (2) temperature detectors 121 and 122. The at least one sensing BAW resonator, or five BAW resonators 105 are disposed adjacent to or are configured so that at least one surface (the sensing surface) is within a fluid channel 125. The at least one resistive heater 115 is generally positioned adjacent the fluid channel 125.

Temperature Detector

The at least one temperature detector can be utilized to directly monitor the temperature of the die itself, indirectly monitor the area around the die, indirectly monitor the temperature of fluid in the fluid channel, or any combination thereof. The at least one temperature detector can be mounted directly on the die or can be constructed as part of the die itself. The location, size or combination thereof of the at least one temperature detector can be chosen such that the desired temperature detection is obtained, a minimum of area is taken up on or in the die itself, undesirable interference with the BAW resonators is minimized, noise inflicted upon the BAW resonator measurements is minimized, cost of fabrication is minimized, or some combination thereof. In some embodiments, the at least one temperature detector can be placed in close proximity (about 1750 μm) to the resonator(s) in order to minimize or eliminate interference with the performance of the resonator. In some embodiments, a device includes at least two temperature detectors, and in some embodiments a device includes two temperature detectors.

The at least one temperature detector can be a thermocouple, a thermistor, or a resistance temperature detector (also referred to as a resistive temperature detector or a RTD). An illustrative thermocouple can include a bi-metal arrangement that could be deposited using conventional thin film techniques (e.g., patterned etch, lift off, lithography, etc.). The thermocouple arrangement could be formed throughout the layered structure (e.g., the layered structure 3100 discussed below). The particular choice of materials for the bi-metal arrangement could depend, at least in part on the temperature range of interest. In some embodiments, this temperature range of interest could be low (Type N thermocouples, Type T thermocouples, Chromel (gold/iron-alloy) thermocouples) to intermediate (Type E thermocouples, Type J thermocouples, Type K thermocouples, Type M thermocouples, Type N thermocouples, Type T thermocouples, or pure noble-metal thermocouples (Au—Pt or Pt—Pd)) range. The thermistor approach could utilize formation of a junction. In some embodiments, the thermistor approach could advantageously be utilized in situations where the BAW resonator structure was integrated with an integrated circuit (IC) technology such as bipolar transistors or complementary metal-oxide-semiconductor (CMOS) technology.

In some embodiments, the at least one temperature detector can include a resistance temperature detector. A RTD functions by passing a current through the RTD structure and measuring the resultant voltage differential across the RTD terminals. As a practical example, if a current of 0.1 milliAmps (mA) is applied and the RTD has a nominal resistance of 100 ohms (Ω), the resulting voltage differential will be 0.01 volts (V). Such voltages can be accurately and precisely measured using an A/D converter of the appropriate number of steps. Typical step sizes for small, relatively cost effective A/D converters include 12, 16, 24, etc. bits.

In some embodiments, a serpentine structure may be desirable because it can minimize the surface area of the die taken up by the resistant temperature detector. In some embodiments, the length and width are such that a finite resistance value (R) is created in the range of 100 ohms (Ω) to about 1000Ω, which can relatively easily be matched in an instrumentation amplifier.

In some embodiments, the at least one resistant temperature detector can be implemented as a serpentine of thin-film metal whose resistivity is such that a resistance of about 100Ω to about 1000Ω can be accomplished over a desirable surface area of the die. In some embodiments, the at least one resistant temperature detector can be implemented as a serpentine of thin-film metal whose resistivity is such that a resistance of about 100Ω to about 1000Ω can be accomplished over in a desired length and width of the serpentine thin-film.

Disclosed resistant temperature detector can be made of any conductive metal or alloys thereof. In some embodiments disclosed resistant temperature detector can be made of a material that has an acceptable temperature coefficient of resistance (TCR). Illustrative materials can include, for example, aluminum (Al), copper (Cu), tungsten (W), gold (Au), platinum (Pt), palladium (Pd), molybdenum (Mo), or combinations thereof. In some embodiments, an aluminum copper alloy (AlCu) can be utilized. In some embodiments, aluminum (Al) can be utilized in resistant temperature detector.

Figure 2:
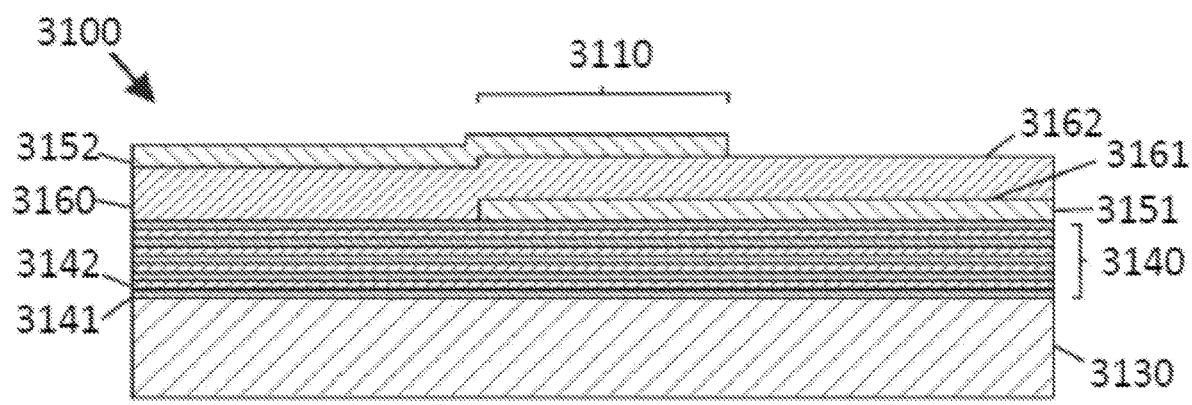
FIG. 2 is a schematic cross-sectional view of a bulk acoustic wave resonator.

In some embodiments, a layer of the device that is present for another purpose can be utilized to form the at least one resistant temperature detector. FIG. 2 is a schematic cross-sectional view of a portion of a layered structure 3100 that can be utilized to form a BAW resonator that can be utilized in disclosed devices. The layered structure 3100 includes a substrate 3130 (e.g., typically silicon or another semiconductor material), an acoustic reflector 3140 (e.g., alternating thin layers 3141, 3142 of materials (e.g., silicon oxicarbide [SiOC], silicon nitride [Si$_3$N$_4$], silicon dioxide [SiO$_2$], aluminum nitride [AlN], tungsten [W], and molybdenum [Mo]) having different acoustic impedance values, optionally embodied in a quarter-wave Bragg mirror, deposited over the substrate 3130) arranged over the substrate 3130, a piezoelectric material 3160, and bottom and top side electrodes 3151, 3152. The bottom side electrode 3151 is arranged along a portion of a lower surface 3161 of the piezoelectric material 3160 (between the acoustic reflector 3140 and the piezoelectric material 3160), and the top side electrode 3152 is arranged along a portion of an upper surface 3162 of the piezoelectric material 3160. An area in which the piezoelectric material 3160 is arranged between overlapping portions of the top side electrode 3152 and the bottom side electrode 3151 is considered an active region 3110 of the layered structure 3100 to which a biomolecule can be applied. One or more of the resonators 105 in FIG. 1 can be made up of structures similar to or structures such as active region 3110 in FIG. 2.

Steps for forming the layered structure 3100 may include depositing the acoustic reflector 3140 over the substrate 3130, followed by deposition of the bottom side electrode 3151, followed by growth (e.g., via sputtering or other appropriate methods) of the piezoelectric material 3160, followed by deposition of the top side electrode 3152.

In certain embodiments, the piezoelectric material 3160 comprises a hexagonal crystal structure piezoelectric material (e.g., aluminum nitride or zinc oxide) that includes a c-axis having an orientation distribution that is predominantly non-parallel (and may also be non-perpendicular to) to normal of a face of the substrate 3130. Under appropriate conditions, presence of a c-axis having an orientation distribution that is predominantly non-parallel to normal of a face of a substrate enables a BAW resonator structure to be configured to exhibit a dominant shear response upon application of an alternating current signal across a distal electrode and a proximal electrode thereof (e.g., as may be desirable in the context of a BAW resonator structure providing sensing utility). Methods for forming hexagonal crystal structure piezoelectric materials including a c-axis having an orientation distribution that is predominantly non-parallel to normal of a face of a substrate are disclosed in U.S. patent application Ser. No. 15/293,063 filed on Oct. 13, 2016. Additional methods for forming piezoelectric materials having an inclined c-axis orientation are disclosed in U.S. Pat. No. 4,640,756 issued on Feb. 3, 1987.

The top side electrode 3152 and the bottom side electrode 3151 are generally made of a conductive material. The two electrodes can independently be made of materials such as aluminum (Al), copper (Cu), tungsten (W), gold (Au), platinum (Pt), palladium (Pd), molybdenum (Mo), or combinations thereof. In some embodiments, the two electrodes can independently be made of materials such as aluminum (Al) or an aluminum alloy.

In some embodiments, the material making up the top side electrode 3152, the bottom side electrode 3151, or portions of the acoustic layer 3140 (e.g., tungsten (W), molybdenum (Mo), etc.) or combinations thereof can be utilized to form the at least one resistant temperature detector. In some embodiments, when the layered structure 3110 is being formed, the material of at least the layer(s) of interest (e.g., the top side electrode 3152 layer, the bottom side electrode 3151 layer, a portion of the acoustic layer 3140, or combinations thereof), can be deposited across more surface area than necessary for formation of the active region 3110. The portion of the layer(s) of interest that is not necessary for formation of the active region 3110 can then be utilized to form the at least one resistant temperature detector. For example, a deposited layer of conductive material (of the layer(s) of interest) can be processed, using conventional thin film techniques, including for example patterned etching, lithography, lift off techniques, etc. In some embodiments, a portion of one or more layers of the acoustic layer 3140 not within the footprint active region 3110 can be utilized to form the at least one resistant temperature detector. In some embodiments, a portion of one or more layers of the acoustic layer 3140 made of tungsten (W), molybdenum (Mo), or a combination thereof not within the footprint of the active region 3110 can be utilized to form the at least one resistant temperature detector.

In some embodiments where the at least one resistant temperature detectors is formed from a portion of the acoustic layer 3140, vias through overlying, underlying, or both layers can be formed to connect the resistant temperature detector to additional circuitry necessary to operate and monitor the at least one resistant temperature detector. In some embodiments, four (4)-point (full Kelvin) connections can be utilized.

In some embodiments, the at least one resistant temperature detector can be formed from portions of the top side electrode 3152, the bottom side electrode 3151, or combinations thereof that are not within the footprint of the active region 3110. In some embodiments, the at least one resistant temperature detector can be formed from the particular layer before the next layer is deposited thereon. In some embodiments, at least one resistant temperature detector can be formed from a portion of the top side electrode 3152, the bottom side electrode 3151, or combinations thereof that are not within the footprint of the active region of the resonator structure; can have a serpentine structure (e.g., similar to that in FIG. 1); can be made of aluminum; can have an overall length of from 17,500 µm to 19,500 µm, from 18,000 µm to 19,000 µm, from 18,000 µm to 18,800 µm, from 18,200 µm to 18,600 µm; from about 18,300 µm to 18,400 µm; or about 18,340 µm (e.g., 18,342±2 µm); can have a width from 8 µm to 12 µm, from 9 µm to 11 µm, from 9.5 µm to 10.5 µm, or about 10 µm (e.g., 10±0.1 µm); can have a thickness from about 0.05 to 0.15 µm, from about 0.07 to 0.11 µm, from about 0.08 to 0.10 µm, or about 0.09 µm (e.g., 0.09±0.005 µm); can have a calculated finite resistance value (R) from about 600Ω to about 800Ω, from about 620Ω to about 780Ω, from about 660Ω to about 740Ω, from about 680Ω to about 705Ω, or about 693Ω (e.g., 693±3Ω); or any combinations thereof. In some embodiments, a device includes at least one resistant temperature detector. In some embodiments, a device includes at least two resistant temperature detectors. In some embodiments, a device includes two resistant temperature detectors. In some embodiments, a device includes two resistant temperature detectors having some combination of the illustrative features described in this paragraph.

Heater

Disclosed devices include at least one heater. The at least one heater can generally be described as a resistive heater in that the heater includes a trace of metal connected to a voltage heater can be utilized to directly increase the temperature of the die itself, indirectly increase the temperature of the area around the die, indirectly increase the temperature of fluid in the fluid channel, or any combination thereof. The at least one heater can be mounted directly on the die or can be constructed as part of the die itself. The location, size or combination thereof of the at least one heater can be chosen such that the desired heating is obtained, a minimum of area is taken up on or in the die itself (or in or on the cartridge), undesirable interference with the BAW resonators is minimized, noise inflicted upon the BAW resonator measurements is minimized, cost of fabrication is minimized, or some combination thereof. In some embodiments, the at least one heater can be placed in close proximity (about 215 µm) to the resonator(s) in order to minimize or eliminate interference with the performance of the resonator. In some embodiments, a device includes at least two heaters, and in some embodiments a device includes two heaters.

In some embodiments, the resistive heater can span a length that is almost the entire length of the die. Such an embodiment may be advantageous because fluid in the fluid path 125 enters at the right side of the device (or die) 100 and flows from right to left and back towards the right to the BAW sensors 105, thereby having additional time to acquire heat from the die, thereby equilibrating its temperature before it reaches the BAW resonators 105. Even in embodiments where the fluid path 125 does not have a U shape, a resistive heater that spans more of the die may be advantageous because the fluid can acquire heat from the die, thereby equilibrating its temperature before it reaches the BAW resonators. Either of these illustrative configurations can make it more likely that the fluid in the fluid path 125 is the same temperature as the die or has additional time to equilibrate, e.g., reach the desired temperature, before it reaches the BAW resonators 105. Therefore, the at least one resistive heater functions to heat the die and liquid flow over the die functions to heat and/or equilibrate the liquid temperature before it reaches the BAW resonators.

A resistive heater functions by passing a current through the heater causing the heater material to dissipate heat therefrom. As a practical example, if the resistance is 500Ω, a driving voltage of 1 (one) volt (V) will result in a power dissipation of 2 milliWatts (mW). If the total mass of the die, for example, is approximately 0.025 grams and if the driving voltage is applied for about 10 seconds, the total temperature rise will be about 1.2 Kelvins (K), assuming the total mass of the die is silicon. As heat is dissipated out of the die, power may be additionally input into the heater in order to re-supply the heat lost to the environment.

In some embodiments, a serpentine structure may be desirable because it can minimize the surface area of the die taken up by the resistive heater. In some embodiments, the length of the resistive heater is sufficiently long and the width is sufficiently narrow to create a finite resistance (R) value that will generate approximately 10 to 50 mW of power.

Disclosed resistive heaters can be made of any conductive metal or alloys thereof. In some embodiments disclosed resistive heaters can be made of materials such as, for example, aluminum (Al), copper (Cu), tungsten (W), gold (Au), platinum (Pt), palladium (Pd), molybdenum (Mo), or combinations thereof. In some embodiments, an aluminum copper alloy (AlCu) can be utilized. In some embodiments, aluminum (Al) can be utilized in resistive heaters.

In some embodiments, a layer of the device that is present for another purpose can be utilized to form the at least one resistive heater, similar to the resistant temperature detector. As seen in FIG. 2 and as discussed above, the material making up the top side electrode 3152, the bottom side electrode 3151, or portions of the acoustic layer 3140 (e.g., tungsten (W), molybdenum (Mo), etc.) or combinations thereof can be utilized to form the at least one resistive heater. In some embodiments, when the layered structure 3110 is being formed, the material of at least the layer(s) of interest (e.g., the top side electrode 3152 layer, the bottom side electrode 3151 layer, a portion of the acoustic layer 3140, or combinations thereof), can be deposited across more surface area than necessary for formation of the active region 3110. The portion of the layer(s) of interest that is not necessary for formation of the active region 3110 can then be utilized to form the at least one resistive heater. For example, a deposited layer of conductive material (of the layer(s) of interest) can be processed, using conventional thin film techniques, including for example patterned etching, lithography, lift off techniques, etc. In some embodiments, a portion of one or more layers of the acoustic layer 3140 not within the footprint active region 3110 can be utilized to form the at least one resistive heater. In some embodiments, a portion of one or more layers of the acoustic layer 3140 made of tungsten (W), molybdenum (Mo), or a combination thereof not within the footprint of the active region 3110 can be utilized to form the at least one resistive heater.

In some embodiments, the at least one resistive heater can be formed from portions of the top side electrode 3152, the bottom side electrode 3151, or combinations thereof that are not within the footprint of the active region 3110. In some embodiments, the at least one resistive heater can be formed from the particular layer before the next layer is deposited thereon. In some embodiments, at least one resistive heater can be formed from a portion of the top side electrode 3152, the bottom side electrode 3151, or combinations thereof that are not within the footprint of the active region of the resonator structure; can have a serpentine structure (e.g., similar to that in FIG. 1); can be made of aluminum; can have an overall length of from 40,000 µm to 85,000 µm, from 45,000 µm to 80,000 µm, from 50,000 µm to 75,000

μm, from 55,000 μm to 70,000 μm; from about 60,000 μm to 66,000 μm; or about 63,100 μm (e.g., 63,100±50 μm); can have a width from 15 μm to 35 μm, from 20 μm to 30 μm, from 22 μm to 28 μm, or about 25 μm (e.g., 25±0.5 μm); can have a thickness from about 0.05 to 0.15 μm, from about 0.07 to 0.11 μm, from about 0.08 to 0.10 μm, or about 0.09 μm (e.g., 0.09±0.005 μm); can have a calculated finite resistance value (R) from about 700Ω to about 1200Ω, from about 800Ω to about 1100Ω, from about 900Ω to about 1000Ω, from about 920Ω to about 985Ω, or about 954Ω (e.g., 954±4Ω); or any combinations thereof. In some embodiments, a device includes at least one resistive heater. In some embodiments, a device includes at least two resistive heaters. In some embodiments, a device includes resistive heaters. In some embodiments, a device includes two resistive heater s having some combination of the illustrative features described in this paragraph.

In some embodiments, the combination of the resistive heater and the temperature detector, operated in a closed loop fashion may provide temperature control of about ±0.001 K, for example.

Methods of Controlling Temperature

Also disclosed herein are methods of controlling temperature in the vicinity of a BAW resonator. Such methods can include at least steps of monitoring the temperature in the vicinity of the BAW resonator utilizing the at least one temperature detector and passing a current through the at least one resistive heater based on the monitored temperature. In some embodiments these steps can be repeated in succession in a closed loop type fashion until, as long as, or both, a desired temperature is obtained or maintained.

In some methods of controlling the temperature in the vicinity of a BAW resonator, additional layers of temperature control can also be utilized. In some embodiments, different methods can be utilized to control temperatures at different levels of accuracy, for example.

In some embodiments, a relatively rough or coarse level of temperature control can be obtained via the system that the device can be utilized in, or more specifically the results read by. For example, a disclosed device can be housed in a cartridge (discussed more below) that may be part of a system that includes a reader that is constructed to physically receive the cartridge. The reader may be used to read and optionally interpret results from the BAW sensor in the cartridge via electrical connection through electrical contacts on the cartridge, the sensor platform, or both. The reader may optionally include a temperature control unit (e.g., temperature monitor, heater, or both) and may also serve to insulate the cartridge from external variations in temperature. This level of temperature control can be considered the coarsest method of controlling temperature and in some embodiments can be undertaken or considered first.

Figure 3:
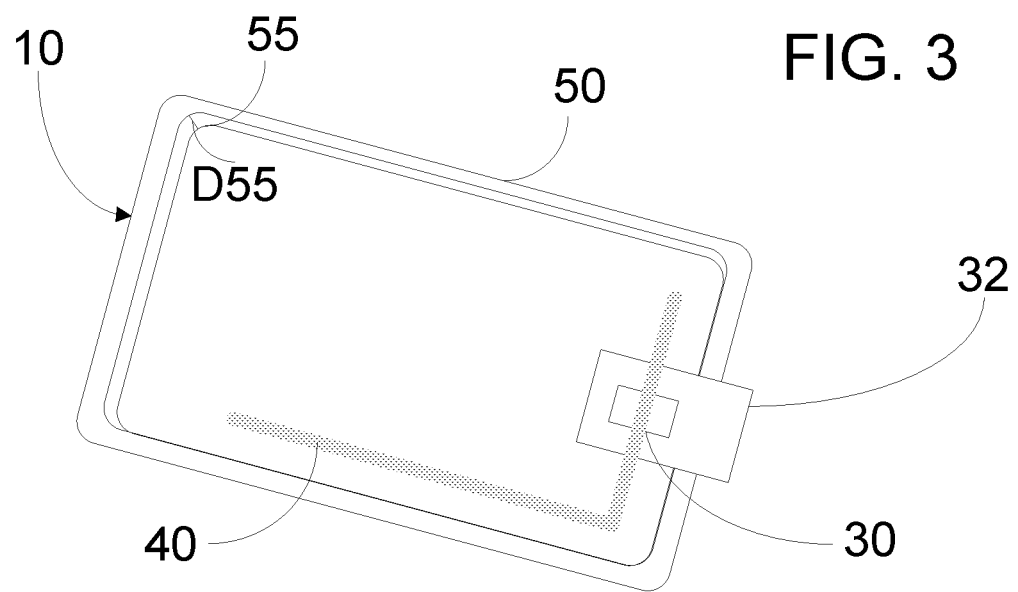
FIG. 3 is a perspective view of the cartridge of FIG. 3 with its cover removed.

In some embodiments, another method of controlling temperature, which is less coarse than the control provided by the reader (e.g., via insulation from external temperature variation, temperature control via a heater and/or temperature monitor, or both) is provided by an optional feature formed in the cartridge itself. Referring now to FIG. 3, a cartridge 10 housing a die 32 that includes a BAW resonator sensor 30 is shown. According to an embodiment, the cartridge 10 contains a fluid flow path 40 constructed to guide the sample across the sensing surface of a BAW resonator sensor 30 arranged in the fluid flow path 40. The fluid flow path 40, the BAW sensor 30, and other parts discussed in more detail below, are housed in a cartridge housing 50. The shape and size of the cartridge housing 50 is not particularly limited, and the cartridge 10 may have any suitable shape and size. In the embodiment shown, the cartridge 10 has a useful width and length, which can be approximately similar to those of a standard size credit card (e.g., about 50 to 60 mm wide and 80 to 90 mm long). The housing 50 includes a cavity 55 that can function to insulate the sensor platform from varying temperatures in the system and external to the system. The cavity 55 can also function to minimize convection, conduction and radiative methods of heat transfer to and from the biosensor platform. In some embodiments, the cavity 55 can have a depth D55 of about 5 to about 7 mm.

Figure 4A:
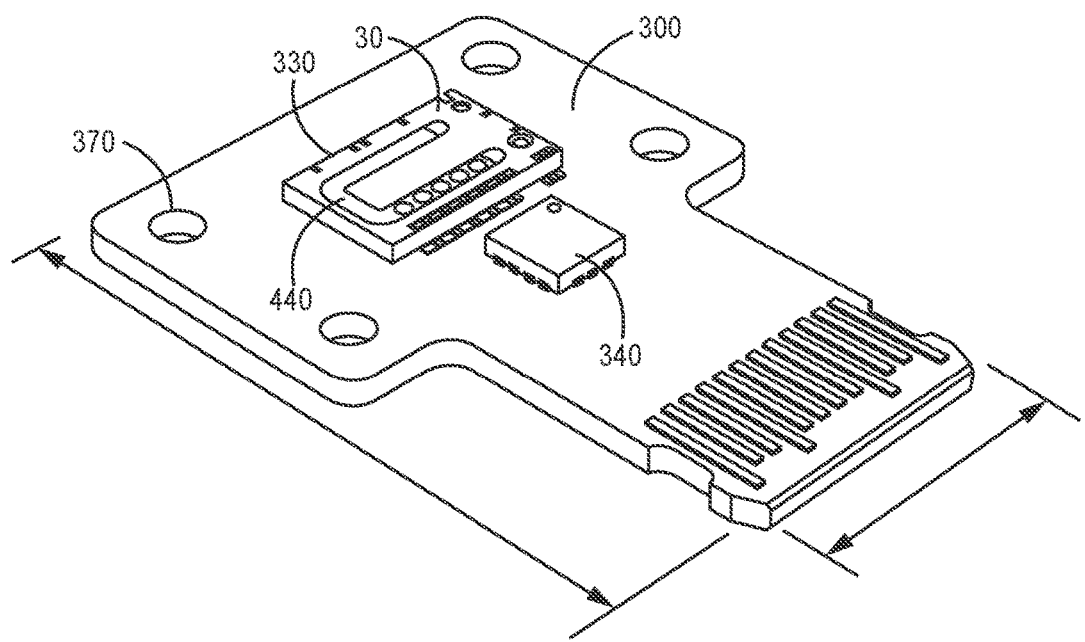
FIG. 4A is a top perspective view of a sensor platform for the cartridge of FIG. 3.
Figure 4B:
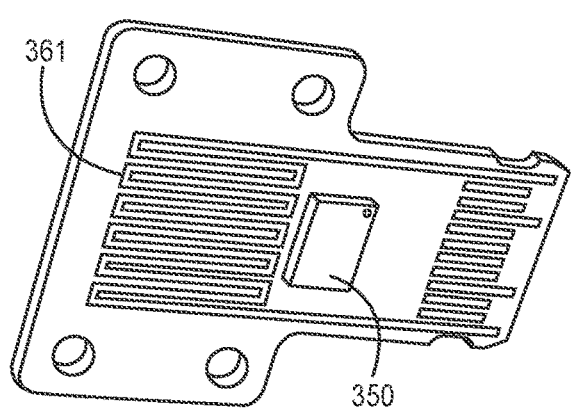
FIG. 4B is a bottom perspective view of the sensor platform of FIG. 4A.

In some embodiments, another method of controlling temperature, which is less coarse than the control provided by the cavity in the cartridge, is provided by a heater on the sensor platform. As seen in FIGS. 4A and 4B, the BAW sensor 30 may be provided on a sensor platform 300 that may include the die 30. The sensor platform 300 can be described as a printed circuit board (PCB). The heater 361 on the sensor platform can be an electrically resistive heater. It should be noted that such a heater would function in the same way as the heater described above formed on the die, but may be of a larger size. In some embodiments, the sensor platform heater can be serpentine in shape. In some embodiments, the sensor platform heater can have dimension of a millimeter (mm) scale. In some embodiments, the area taken up by the sensor platform heater can range from 3 mm to 12 mm, from 5 mm to 10 mm, or from 5 mm to 7 mm, for example. An optional heater on the sensor platform can provide temperature control of ±0.1 K, for example. In some embodiments, the heater 361 on the sensor platform 300 can be operated in a closed loop fashion, by using one of the temperature detectors on the die (discussed above). In some embodiments that include more than one temperature detector on the die, such as more than one resistant temperature detector, a first temperature detector can be utilized to control the temperature of a heater on the die and a second temperature detector can be utilize to control the temperature of the heater 361 on the sensor platform 300.

The sensor platform 300 may also optionally include a RF switch 340 and other circuit components, such as a control and memory unit 350 and other electronic components to stimulate the BAW, condition the signal, control all electrical components and to communicate with the various electronics on the die 30 and in the cartridge 10.

Some disclosed embodiments include devices comprising: at least one sensing bulk acoustic wave (BAW) resonator comprising a sensing surface; a fluid channel, wherein the sensing surface of the at least one sensing BAW resonator is disposed adjacent to or within the fluid channel; 11° at least one resistive heater; and at least one temperature detector, wherein the at least one temperature detector is configured to monitor the temperature adjacent to the at least one BAW resonator and affect a current to be passed through the at least one resistive heater.

Also disclosed are any of the above embodiments, wherein the at least one temperature detector is a thermocouple, a thermistor, or a resistance temperature detector. Also disclosed are any of the above embodiments, the at least one temperature detector is a resistance temperature detector. Also disclosed are any of the above embodiments, wherein the resistance temperature detector has a serpentine structure with an overall length, an average width and an average thickness. Also disclosed are any of the above embodiments, wherein the serpentine structure has an overall length from 17,500 μm to 19,500 μm; from 18,000 μm to 19,000 μm; from 18,000 μm to 18,800 μm; from 18,200 μm to 18,600 μm; or from about 18,300 μm to 18,400 μm. Also disclosed are any of the above embodiments, the serpentine structures has an average width 8 μm to 12 μm; from 9 μm to 11 μm; from 9.5 μm to 10.5 μm; or about 10 μm. Also disclosed are any of the above embodiments, wherein the serpentine structure has an average thickness of 0.05 to 0.15 μm; from 0.07 to 0.11 μm; from 0.08 to 0.10 μm; or about 0.09 μm. Also disclosed are any of the above embodiments, wherein the resistance temperature detector has a calculated finite resistance value (R) from 600Ω to 800Ω; from 620Ω to 780Ω; from 660Ω to 740Ω; from 680Ω to 705Ω; or about 693Ω. Also disclosed are any of the above embodiments, wherein the resistance temperature detector comprises aluminum (Al), copper (Cu), tungsten (W), gold (Au), platinum (Pt), palladium (Pd), molybdenum (Mo), or combinations thereof. Also disclosed are any of the above embodiments, wherein the resistance temperature detector comprises aluminum (Al). Also disclosed are any of the above embodiments, wherein the resistance temperature detector is made from a material deposited when a portion of the at least one sensing BAW resonator was made. Also disclosed are any of the above embodiments, wherein the resistance temperature detector is made from a material deposited when an acoustic reflector portion, a top side electrode portion or a bottom side electrode portion of the at least one sensing BAW resonator was made. Also disclosed are any of the above embodiments, wherein the resistance temperature detector is made from a material deposited when a top side electrode portion or a bottom side electrode portion of the at least one sensing BAW resonator was made. Also disclosed are any of the above embodiments further comprising a second resistance temperature detector. Also disclosed are any of the above embodiments, wherein the at least one resistive heater has a serpentine structure with an overall length, an average width and an average thickness. Also disclosed are any of the above embodiments, wherein the overall length of the serpentine structure of the at least one resistive heater is from 40,000 μm to 85,000 μm; from 45,000 μm to 80,000 μm; from 50,000 μm to 75,000 μm; from 55,000 μm to 70,000 μm; from 60,000 μm to 66,000 μm; or about 63,100 μm. Also disclosed are any of the above embodiments, wherein the average width of the serpentine structure of the at least one resistive heater is from 15 μm to 35 μm; from 20 μm to 30 μm; from 22 μm to 28 μm; or about 25 μm. Also disclosed are any of the above embodiments, wherein the average thickness of the serpentine structure of the at least one resistive heater is from 0.05 to 0.15 μm; from 0.07 to 0.11 μm; from 0.08 to 0.10 μm; or about 0.09 μm. Also disclosed are any of the above embodiments, wherein the resistive heater has a calculated finite resistance value (R) from 700Ω to 1200Ω, from 800Ω to 1100Ω, from 900Ω to 1000Ω, from 920Ω to 985Ω, or about 954Ω. Also disclosed are any of the above embodiments, wherein the resistive heater can generate approximately 10 to 50 mW of power. Also disclosed are any of the above embodiments, wherein the resistive heater comprises aluminum (Al), copper (Cu), tungsten (W), gold (Au), platinum (Pt), palladium (Pd), molybdenum (Mo), or combinations thereof. Also disclosed are any of the above embodiments, wherein the resistive heater comprises aluminum (Al). Also disclosed are any of the above embodiments, wherein the resistive heater is made from a material deposited when a portion of the at least one sensing BAW resonator was made. Also disclosed are any of the above embodiments, the resistive heater is made from a material deposited when an acoustic reflector portion, a top side electrode portion or a bottom side electrode portion of the at least one sensing BAW resonator was made. Also disclosed are any of the above embodiments, wherein resistive heater is made from a material deposited when a top side electrode portion or a bottom side electrode portion of the at least one sensing BAW resonator was made. Also disclosed are any of the above embodiments, wherein the device affords temperature control of about ±0.001 K. Also disclosed are any of the above embodiments, wherein the device is housed on a sensor platform. Also disclosed are any of the above embodiments, wherein the sensor platform comprises a second resistive heater. Also disclosed are any of the above embodiments, wherein at least two resistance temperature detectors are included on the device. Also disclosed are any of the above embodiments, wherein the second resistance temperature detector is configured to monitor the temperature adjacent to the at least one BAW resonator and affect a current to be passed through the second resistive heater. Also disclosed are any of the above embodiments, wherein the second resistance temperature detector and the second resistive heater are configured to afford temperature control of about ±0.01 K.

Also disclosed are methods of controlling the temperature in the vicinity of at least one sensing BAW resonator, the method comprising: monitoring the temperature in the vicinity of the sensing BAW resonator utilizing a first temperature detector located adjacent the at least one sensing BAW resonator; and passing a current through a first resistive heater located adjacent the at least one sensing BAW resonator, the current based on the temperature monitored by the first temperature detector.

Also disclosed are any of the above embodiments, wherein the first temperature detector and the first resistive heater are electrically coupled. Also disclosed are any of the above embodiments further comprising monitoring the temperature in the vicinity of the sensing BAW resonator utilizing the first temperature detector a second time. Also disclosed are any of the above embodiments further comprising passing a current through the first resistive heater located adjacent the at least one sensing BAW resonator, the current based on the temperature monitored by the first temperature detector the second time. Also disclosed are any of the above embodiments further comprising sequentially repeating the monitoring and passing steps. Also disclosed are any of the above embodiments further comprising monitoring the temperature in the vicinity of the sensing BAW resonator utilizing a second temperature detector located adjacent the at least one sensing BAW resonator. Also disclosed are any of the above embodiments further comprising passing a second current through a second resistive heater located on a sensor platform, the sensor platform housing a die that houses the at least one sensing BAW resonator, the first resistive heater and the first temperature detector, the second current based on the temperature monitored by the second temperature detector. Also disclosed are any of the above embodiments, wherein the sensor platform is housed on a cartridge, the cartridge comprising a cavity configured to insulate the sensor platform from temperature variations. Also disclosed are any of the above embodiments, wherein the cartridge is configured to be received by a reader, the reader comprising a temperature control unit. Also disclosed are any of the above embodiments, wherein the temperature control unit comprises a temperature monitor, a heater, or both. Also disclosed are any of the above embodiments, wherein the reader is constructed to insulate the cartridge from external variations in temperature.

Those skilled in the art will recognize improvements, variations, and modifications to the exemplary embodiments of the present disclosure. All such improvements and modifications are considered within the scope of the concepts disclosed here and the claims that follow.

The invention claimed is:

1. A device comprising:
   at least one sensing bulk acoustic wave (BAW) resonator comprising a sensing surface;
   a fluid channel comprising a first region and second region, wherein the sensing surface of the at least one sensing BAW resonator is disposed adjacent to or within the second region of the fluid channel;
   at least one resistive heater positioned adjacent to the first region of the fluid channel, the at least one resistive heater comprising aluminum (Al), copper (Cu), tungsten (W), gold (Au), platinum (Pt), palladium (Pd), molybdenum (Mo), or combinations thereof; and
   at least one temperature detector positioned adjacent to the first region of the fluid channel,
   wherein the at least one temperature detector is configured to monitor the temperature adjacent to the first region of the fluid channel and affect a current to be passed through the at least one resistive heater.

2. The device according to claim 1, wherein the at least one temperature detector is a thermocouple, a thermistor, or a resistance temperature detector.

3. The device according to claim 1, wherein the at least one temperature detector is a resistance temperature detector that has a serpentine structure with an overall length from 17,500 µm to 19,500 µm, an average width from 8 µm to 12 µm and an average thickness from 0.05 to 0.15 µm.

4. The device according to claim 3, wherein the resistance temperature detector has a calculated finite resistance value (R) from 600Ω to 800 Ω.

5. The device according to claim 3, wherein the resistance temperature detector comprises aluminum (Al), copper (Cu), tungsten (W), gold (Au), platinum (Pt), palladium (Pd), molybdenum (Mo), or combinations thereof.

6. The device according to claim 3, wherein the resistance temperature detector comprises aluminum (Al).

7. The device according to claim 1, further comprising a second resistance temperature detector.

8. The device according to claim 7, wherein the second resistance temperature detector is positioned adjacent to the first region of the fluid channel.

9. The device according to claim 1, wherein the at least one resistive heater has a serpentine structure with an overall length from 40,000 µm to 85,000 µm, an average width from 15 µm to 35 µm, and an average thickness from 0.05 to 0.15 µm.

10. The device according to claim 9, wherein the resistive heater has a calculated finite resistance value (R) from 700Ω to 1200 Ω.

11. The device according to claim 1, wherein the resistive heater can generate approximately 10 to 50 mW of power.

12. The device according to claim 1, wherein the device affords temperature control of about +0.001 K.

13. A device comprising a device according to claim 1, wherein the device is housed on a sensor platform.

14. The device according to claim 13, wherein the sensor platform comprises at least a second resistive heater.

15. A method of controlling the temperature in the vicinity of at least one sensing BAW resonator, wherein a sensing surface of the at least one sensing BAW resonator is disposed adjacent to or within a second region of a fluid channel, the method comprising:
    monitoring the temperature in the vicinity of the sensing BAW resonator utilizing a first temperature detector positioned adjacent to a first region of the fluid channel; and
    passing a current through a first resistive heater positioned adjacent to the first region of the fluid channel and located adjacent the at least one sensing BAW resonator, the resistive heater comprising aluminum (Al), copper (Cu), tungsten (W), gold (Au), platinum (Pt), palladium (Pd), molybdenum (Mo), or combinations thereof, the current based on the temperature monitored by the first temperature detector.

16. The method according to claim 15, wherein the first temperature detector and the first resistive heater are electrically coupled.

17. The method according to claim 15 further comprising monitoring the temperature in the vicinity of the sensing BAW resonator utilizing the first temperature detector a second time.

18. The method according to claim 17 further comprising passing a current through the first resistive heater located adjacent the at least one sensing BAW resonator, the current based on the temperature monitored by the first temperature detector the second time.

19. The method according to claim 15 further comprising sequentially repeating the monitoring and passing steps.

20. A device comprising:
    at least one sensing bulk acoustic wave (BAW) resonator comprising a sensing surface;
    a fluid channel comprising a first region, a second region, and a third region,
        wherein the third region connects the first region and the second region to form a "U" shaped fluid channel,
        wherein the sensing surface of the at least one sensing BAW resonator is disposed adjacent to or within the second region of the fluid channel;
    at least one resistive heater positioned adjacent to the first region of the fluid channel, the at least one resistive heater comprising aluminum (Al), copper (Cu), tungsten (W), gold (Au), platinum (Pt), palladium (Pd), molybdenum (Mo), or combinations thereof; and
    at least one temperature detector positioned adjacent to the first region of the fluid channel,
    wherein the at least one temperature detector is configured to monitor the temperature adjacent to the first region of the fluid channel and affect a current to be passed through the at least one resistive heater.

* * * * *